(12) United States Patent
Murali et al.

(10) Patent No.: US 6,278,185 B1
(45) Date of Patent: *Aug. 21, 2001

(54) SEMI-ADDITIVE PROCESS (SAP) ARCHITECTURE FOR ORGANIC LEADLESS GRID ARRAY PACKAGES

(75) Inventors: Venkatesan Murali, San Jose, CA (US); Kenzo Ishida, Tsukuba (JP); Brian A. Kaiser, Saratoga; Anant Vaidyanathan, San Jose, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/085,546

(22) Filed: May 27, 1998

(51) Int. Cl.[7] .......................... H01L 23/48; H01L 23/52; H01L 29/40
(52) U.S. Cl. .......................... 257/750; 257/737; 257/738; 257/780; 257/751; 257/781; 361/762; 361/761
(58) Field of Search .................. 257/737, 738, 257/750, 751, 780, 781; 438/612, 613, 614; 361/762, 761

(56) References Cited

U.S. PATENT DOCUMENTS

| | | | |
|---|---|---|---|
| 5,631,499 | * 5/1997 | Hosomi et al. | 257/737 |
| 5,786,270 | * 7/1998 | Gorrell et al. | 438/613 |
| 5,787,578 | * 8/1998 | Farooq et al. | 29/843 |
| 5,969,424 | * 10/1999 | Matsuki et al. | 257/768 |

* cited by examiner

Primary Examiner—Minh Loan Tran
Assistant Examiner—Luan Thai
(74) Attorney, Agent, or Firm—Blakley, Sokoloff, Taylor & Zafman LLP

(57) ABSTRACT

A substrate which has a first conductive layer that is attached to a first dielectric layer. A second conductive layer is attached to the first dielectric layer. The second conductive layer may be a plated copper material that extends through a via opening of the dielectric and is attached to the first conductive layer. A third conductive layer is attached to the second conductive layer, including a sidewall of the third layer. A second dielectric can be attached to the third conductive layer. The third conductive layer may be a plated nickel-copper composition which improves the adhesion to subsequent layers in the substrate, particularly between the second dielectric and the sidewall of the second conductive layer.

9 Claims, 4 Drawing Sheets

US 6,278,185 B1

SEMI-ADDITIVE PROCESS (SAP) ARCHITECTURE FOR ORGANIC LEADLESS GRID ARRAY PACKAGES

BACKGROUND OF THE INVENTION

1. Field of the Invention

The present invention relates to a substrate for electronic assemblies.

2. Background Information

Integrated circuits are typically assembled into a package that is soldered to a printed circuit board. The integrated circuit may be mounted to a substrate which has a plurality of contacts such as solder balls or pins that are soldered to the printed circuit board. The contacts are typically located on a bottom surface of the substrate. The integrated circuit is typically located on a top surface of the substrate. The package substrate may contain routing traces, power/ground planes and vias that electrically connect the integrated circuit with the contacts located on the other side of the substrate. The substrate may have multiple layers of routing traces and vias to interconnect the integrated circuit and the contacts.

FIGS. 1a–e show a process for forming a substrate of the prior art with interconnect vias. A first conductive layer 1 such as copper may be attached to a first dielectric layer 2. The dielectric layer 2 may have a via opening 3 formed therein. A permanent resist mask 4 may be patterned onto the dielectric layer 2 as shown in FIG. 1b. As shown in FIG. 1c, copper 5 may then be plated onto the areas of the dielectric 2 which are not covered by the resist 4.

As shown in FIG. 1d, a subsequent layer of interplating 6 may be applied to the top of the plated copper material 5. The interplating 6 may be a nickel-copper composition which improves adhesion to subsequent layers in the substrate. A second dielectric layer 7 may then be patterned onto the substrate as shown in FIG. 1e.

The substrate may be subjected to variations in temperature. The changes in temperature may create stresses within the substrate. It has been found that temperature cycling may cause delamination between the permanent solder resist 3 and the sidewalls 8 of the plated copper 5 due to poor adhesion between the permanent solder resist and sidewall of the plated copper. The delamination may create crack initiation sites. Cracks may propagate through the substrate and cause electrical shorts or opens in the package. It would be desirable to provide a process which strengthens the adhesion between the second dielectric layer and the copper sidewalls of a substrate.

SUMMARY OF THE INVENTION

One embodiment of the present invention is a substrate which may have a first conductive layer that is attached to a first dielectric layer. A second conductive layer may be attached to the first dielectric layer. A third conductive layer may be attached to the second conductive layer, including a sidewall of the third layer.

DETAILED DESCRIPTION OF THE INVENTION

One embodiment of the present invention is a substrate which may have a first conductive layer that is attached to a first dielectric layer. A second conductive layer may be attached to the first dielectric layer. The second conductive layer may be a plated copper material that extends through a via opening of the dielectric and is attached to the first conductive layer. A third conductive layer may be attached to the second conductive layer, including a sidewall of the second layer. A second dielectric can be attached to the third conductive layer. The third conductive layer may be a plated nickel-copper composition which improves the adhesion to subsequent layers in the substrate, particularly between the second dielectric and the top and sidewalls of the second conductive layer.

Figure 1A:
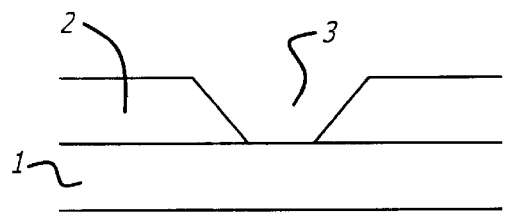
FIGS. 1a–e are illustrations of a process for forming a substrate of the prior art.
Figure 1B:
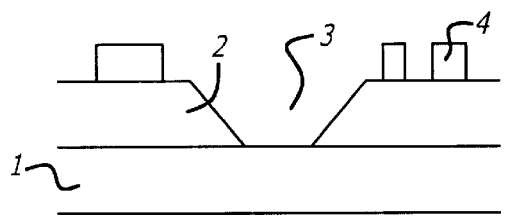
Figure 1C:
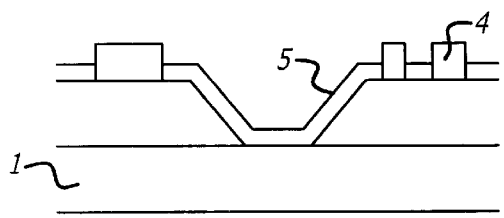
Figure 1D:
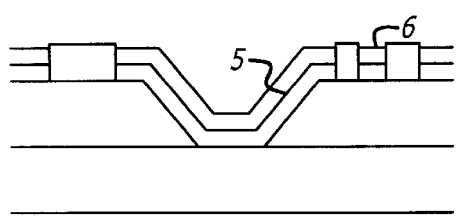
Figure 1E:
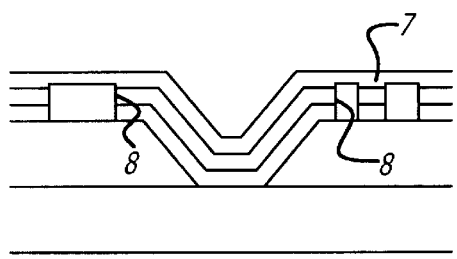
Figure 2:
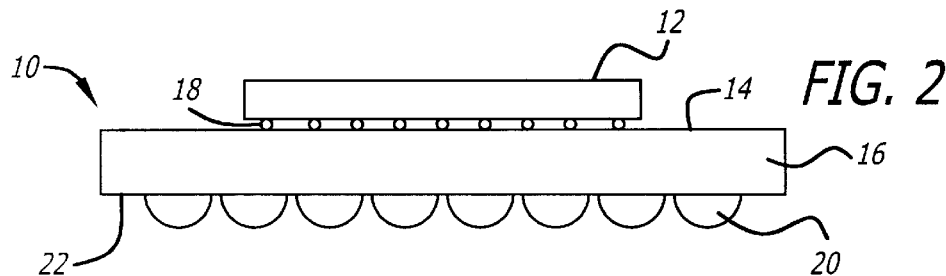
FIG. 2 is a side view an embodiment of an integrated circuit package of the present invention.

Referring to the drawings more particularly by reference numbers, FIG. 2 shows an embodiment of an integrated circuit package of the present invention. The package 10 may include an integrated circuit 12 that is mounted to a first surface 14 of a substrate 16. The integrated circuit 12 may be mounted to the substrate 16 with a plurality of solder bumps 18. The attachment of the integrated circuit 12 to the substrate 16 may be performed with a process commonly referred to as controlled collapsed chip connection (C4). Although a C4 package is shown and described, it is to be understood that the integrated circuit 12 may be attached to the substrate 16 with bond wires or tape automated bonding (TAB) tape or other methods.

A plurality of contacts 20 may be attached to a second surface 22 of the substrate 16. The contacts 20 may be solder balls that are reflowed onto the substrate 16. The contacts 20 may be subsequently attached to a printed circuit board (not shown). The substrate 16 may have surface pads, routing traces, power/ground planes and vias that interconnect the solder bumps 18 to the contacts 20. The substrate 16 may have multiple layers of routing traces, power/ground planes and vias to interconnect the integrated circuit 12 to the contacts 20.

FIGS. 3a–h show a process for forming the substrate 16. A first conductive layer 30 may be attached to a first dielectric layer 32. The first conductive layer 30 may be copper material that is electro- or electroless plated or sputter deposited onto the dielectric. The surface of the dielectric 32 may be roughened before the plating process to improve the adhesion of the plated copper. The plated copper may be annealed at 150 degrees centigrade (° C.) for three hours after the first layer 30 is applied to the dielectric 32. A via opening 34 may be formed in the dielectric layer 32.

Figure 3A:
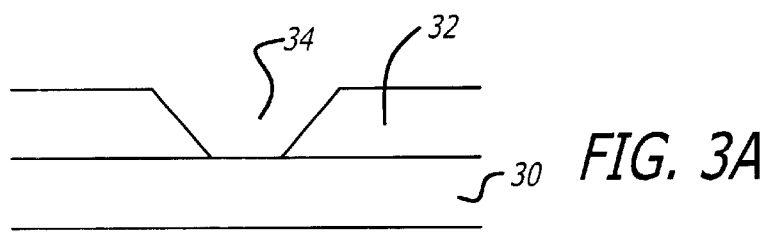
FIGS. 3a–h are illustrations of a process for forming a substrate of the integrated circuit package.
Figure 3B:
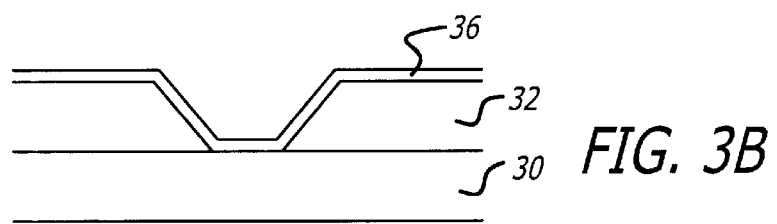

As shown in FIG. 3b, a second conductive layer 36 may be attached to the dielectric 32. The second conductive layer 36 may be copper material that is electroless-plated or sputter deposited onto the dielectric 32. The copper of the second layer 36 may be annealed at 150° C. for three hours. The second conductive layer 36 may extend into the via opening 34 and be attached to the first conductive layer 30.

Figure 3C:
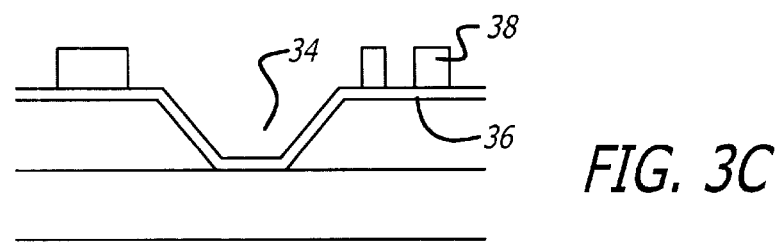

As shown in FIG. 3c, a resist 38 may be patterned onto the second conductive layer 36 in a manner that exposes the via opening 34. The plating resist 38 can be patterned with conventional photolithographic techniques by applying a layer of resist and subsequently removing portions of the resist material.

Figure 3D:
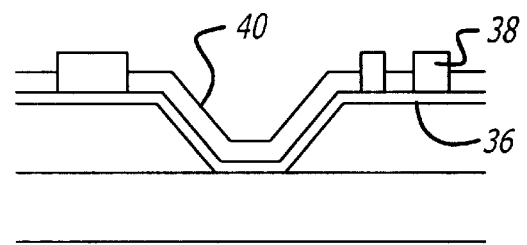
Figure 3E:
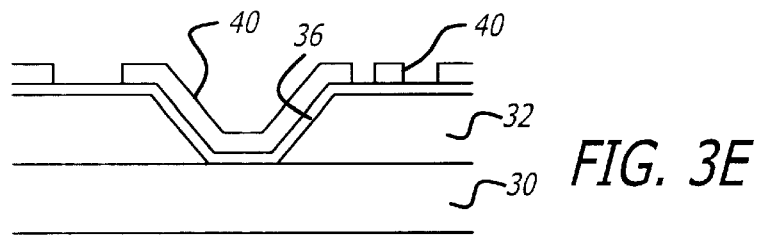
Figure 3F:
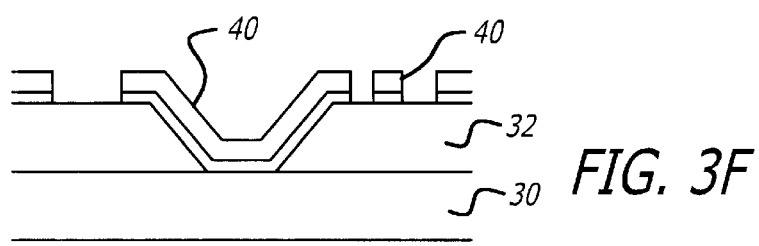

An additional layer of copper material 40 may be electroplated onto the areas of the second conductive layer 36 that are not covered with resist 38 as shown in FIG. 3d. The resist 38 may be removed as shown in FIG. 3e. As shown in FIG. 3f, the exposed copper may be etched away. The thickness of copper added during the step shown in FIG. 3d may be significantly thicker than the copper applied during the step shown in FIG. 3b, so that the additional copper material 40 remains even after the initial copper layer 36 is removed from the dielectric 32 in the areas shown.

Figure 3G:
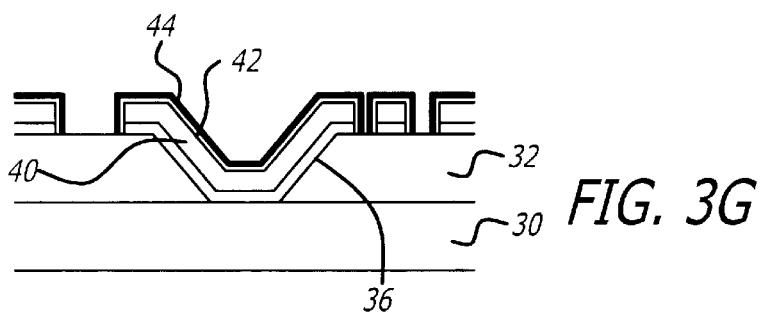

As shown in FIG. 3g, a third conductive layer 42 may then be applied to the copper material 40. The third conductive layer 42 may be a nickel-copper composition that is electroless-plated onto the second layer 36. A very thin layer of tin 44 may be plated onto the nickel-copper composition. The nickel-copper composition may be annealed at 150° C. for three hours, preferably before the application of the tin layer 44. Although not shown, a layer of nickel-copper interplate may also be formed between the first 30 and second 36 conductive layers within the via opening 34, before the formation of the second layer 36 in the step shown in FIG. 3b.

Figure 3H:
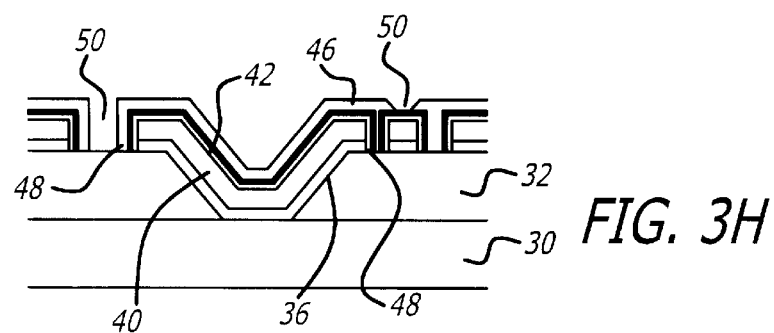

As shown in FIG. 3h, a second dielectric layer 46 may be formed onto the exposed surfaces of the third conductive layer 42 and the first dielectric 32. The removal of the resist 38 prior to the formation of the third conductive layer 42 allows the nickel-copper composition to be plated to the sidewalls 48 of the third layer 42. The nickel-copper interplate improves the adhesion between the second dielectric 46 and the second conductive layer 42 including the sidewalls 48 of the copper material 36 and 40. The second dielectric 46 may include a second via opening 50, wherein the process shown in FIGS. 3a–h may be repeated to form a via and subsequent layers onto the second dielectric 46.

Figure 4A:
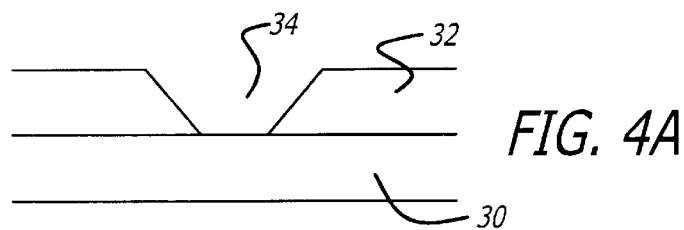
FIGS. 4a–f are illustrations of a process for forming a substrate of the integrated circuit package.
Figure 4B:
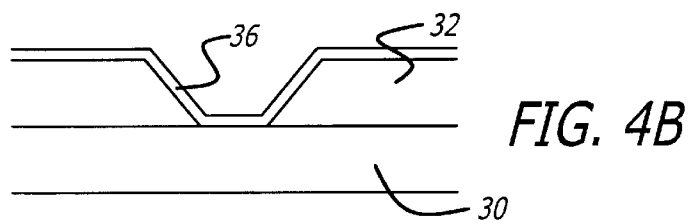

FIGS. 4a–f shows an alternate process for forming the substrate 16. As shown in FIGS. 4a and 4b. A second conductive layer 36 may be plated onto a first dielectric layer 32. The second conductive layer 36 may extend into a via opening 34 of the dielectric 32 and be attached to a first conductive layer 30. The first conductive layer 30 may be copper material that is plated and annealed before the formation of the second layer 36. The second layer 36 may be annealed after plating onto the dielectric 32.

Figure 4C:
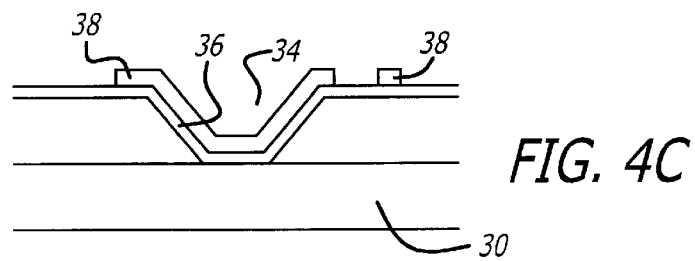
Figure 4D:
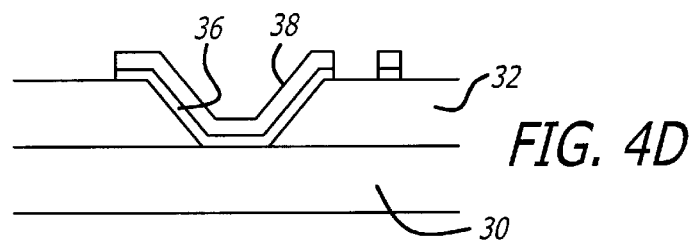
Figure 4E:
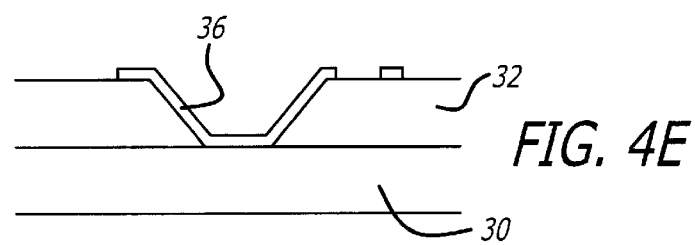

As shown in FIG. 4c, a resist 38 may be patterned onto the second conductive layer 36. The resist pattern may conceal the via opening 34. As shown in FIG. 4d, the exposed areas of the second conductive layer 36 may be etched. The resist 38 may then be removed as shown in FIG. 4e.

Figure 4F:
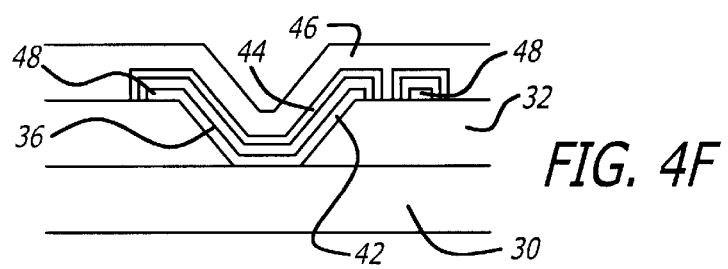

As shown in FIG. 4f, a third conductive layer 42 may be formed onto the exposed areas of the second conductive layer 36. A second dielectric layer 46 may be formed onto the third conductive layer 42 and the exposed areas of the first dielectric 32. The third conductive layer may be a nickel-copper composition 44 that is plated and annealed. A layer of tin 44 may be applied to the third layer 42. The process shown in FIGS. 4a–f also allows the nickel-copper interplate composition 42 to be plated onto the second layer sidewalls 48 to improve the adhesion of the second dielectric 46.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, although a substrate for an integrated circuit package is shown and described, it is to be understood that the processes of the present invention can be implemented into any multi-layer substrate, including a substrate used for a motherboard.

What is claimed is:

1. An electrical substrate, comprising:
    a first conductive layer having an upper surface and a lower surface;
    a first dielectric layer having an upper surface and a lower surface, said lower surface of said first dielectric layer being attached to said upper surface of said first conductive layer, said first dielectric layer optionally being roughened prior to being attached to said first conductive layer to improve the adhesion between said first dielectric layer and said first conductive layer;
    a second conductive layer attached to said first dielectric layer and to said first conductive layer through an opening of said first dielectric layer, said second conductive layer having a sidewall;
    an annealed third conductive layer attached to said second conductive layer including said sidewall of said second conductive layer; and
    a second dielectric layer formed on exposed surfaces of said annealed third conductive layer and said first dielectric layer, said annealed third conductive layer improving the adhesion between said second dielectric layer and said second conductive layer including said sidewall of said second conductive layer.

2. The substrate as recited in claim 1, wherein said third conductive layer includes a plated nickel-copper composition.

3. The substrate as recited in claim 2, further comprising a layer of copper that is attached to said plated nickel-copper composition.

4. The substrate as recited in claim 2, wherein said second conductive layer includes a plated copper material.

5. The substrate as recited in claim 4, wherein said plated copper material is annealed.

6. An integrated circuit package, comprising:
    a substrate which includes;
        a first conductive layer having an upper surface and a lower surface;
        a first dielectric layer having an upper surface and a lower surface, said lower surface of said first electric layer being attached to said upper surface of said first conductive layer, said first dielectric layer being optionally roughened prior to being attached to said first conductive layer to improve the adhesion between said first dielectric layer and said first conductive layer;
        a second conductive layer attached to said first dielectric layer and to said first conductive layer through an opening of said first dielectric layer, said second conductive layer having a sidewall;
        an annealed third conductive layer attached to said second conductive layer including said sidewall of said second conductive layer; and
        a second dielectric layer formed on exposed surfaces of said annealed third conductive layer and said first dielectric layer, said annealed third conductive layer improving the adhesion between said second dielectric layer and said second conductive layer including said sidewall of said second conductive layer;
    an integrated circuit attached to said substrate.

7. The package as recited in claim 6, wherein said integrated circuit is attached to said substrate by a solder bump.

8. The package as recited in claim 6, further comprising a solder ball that is attached to said substrate.

9. The package as recited in claim 6, wherein said second conductive layer is annealed.

* * * * *